United States Patent [19]

Woods et al.

[11] 4,166,244

[45] Aug. 28, 1979

[54] LEAKAGE DETECTION SYSTEM FOR RADIOACTIVE WASTE STORAGE TANKS

[75] Inventors: Weightstill W. Woods, Redmond; William A. Eul, Seattle, both of Wash.

[73] Assignee: The Boeing Company, Seattle, Wash.

[21] Appl. No.: 743,111

[22] Filed: Nov. 19, 1976

[51] Int. Cl.² .......................................... G01R 27/02
[52] U.S. Cl. ................................... 324/65 R; 324/64; 340/605
[58] Field of Search ............... 324/65 R, 64; 340/242, 340/235

[56] References Cited

U.S. PATENT DOCUMENTS

| | | | |
|---|---|---|---|
| 2,123,545 | 7/1938 | Pearson | 324/64 X |
| 2,141,590 | 12/1938 | Blondeau | 324/64 X |
| 3,331,021 | 7/1967 | Marsh et al. | 324/65 R X |
| 3,339,138 | 8/1967 | Baker et al. | 324/64 |
| 3,453,151 | 7/1969 | Fox | 340/242 X |

FOREIGN PATENT DOCUMENTS 1006927  10/1965  United Kingdom ...................... 324/64

*Primary Examiner*—Stanley T. Krawczewicz
*Attorney, Agent, or Firm*—Cole, Jensen & Puntigam

[57] ABSTRACT

A combination of elements for detecting leakage of electrically conductive fluids from tanks, including a reference electrode, an AC generator connected between the tank and the reference electrode, and one or more sensing electrodes positioned between the tank and the reference electrode. The storage tank and reference electrode are in contact with the ground. When the AC generator is energized, current flows in the circuit, and creates an electric field in the ground between the tank and the reference electrode. The sensing electrodes are positioned so that they are within the electric field when the AC generator is energized. An electric potential measuring device, such as a voltmeter, is used to measure the electric potential at the sensing electrodes relative to the tank. A significant change in the electric potential at any one or more of the sensing electrodes is an indication that a leak has occurred in the tank.

19 Claims, 9 Drawing Figures ance 4,166,244

LEAKAGE DETECTION SYSTEM FOR RADIOACTIVE WASTE STORAGE TANKS

BACKGROUND OF THE INVENTION

The present invention concerns a leakage detection system for tanks used to store electrically conductive fluids. The invention was developed specifically for detecting leaks from large tanks storing radioactive wastes.

Proper radioactive waste management is becoming increasingly important as the use of nuclear energy for generation of electric power increases. Conventional nuclear power plants produce a considerable amount of radioactive waste material, which in turn must be stored in a manner so as to prevent harm to human beings and/or contamination of the environment.

Although radioactive wastes are currently being disposed of in a variety of ways, one of the most common methods involves neutralizing the acidic nitrated radioactive waste material with an alkali, producing a salt solution, which is then stored in large, specially designed and constructed, tanks which may either be buried underground or stored in underground facilities.

Even though such storage tanks have been specially designed to contain, long-term, the radioactive waste solution, it has been found, particularly over the past several years, that a significant percentage of the original storage tanks have developed leaks, due to the effect over time of the extremely corrosive waste solution. With respect to the storage tanks already in use, as well as those which are currently being designed and manufactured, it is extremely important that any leakage of the waste solution be minimized.

Furthermore, if and when leaks do develop in such storage tanks, it is vital that they be quickly and accurately detected. By early detection, damage to the storage environment (i.e. the surrounding soil) can hopefully be minimized, and the basic integrity of the storage tanks maintained over a considerable period of time.

Presently, however, existing instrumentation for the detection of leaks, which typically take the form of a float for sensing liquid level in a tank, have a minimum resolution capability of approximately 8,000 gallons. In addition, frequent pumping of waste into and out of storage tanks equipped with float sensors causes level changes which mask a slow loss of waste solution. Substantial damage both to the storage environment and the tank itself can thus occur before a leak can be detected by existing detection systems.

Furthermore, such conventional leak detection systems must be used within the tank itself. The harsh environment within the tank inevitably leads to a degradation of performance of the leak detection system, thereby creating additional problems of system monitoring and replacement.

In view of the above, it is a general object of the present invention to provide a leak detection system for storage tanks containing electrically conductive fluids, specifically, underground radioactive waste storage tanks, which overcomes one or more disadvantages of the prior art specified above.

It is another object of the present invention to provide such a detection system which may be located external to the tank under test.

It is a further object of the present invention to provide such a detection system which has the capability of detecting leaks within a short time after they occur.

It is an additional object of the present invention to provide such a detection system which is capable of detecting a leak of less than 50 gallons.

It is yet another object of the present invention to provide such a detection system which is capable of accurately locating the place of the leak on the tank.

It is a still further object of the present invention to provide such a detection system which is useful within a tank farm.

It is an additional object of the present invention to provide such a detection system which may be selectively actuated to measure each tank in turn in a tank array.

It is a still further object of the present invention to provide such a detection system which operates under widely varying nominal soil conditions and is insensitive to normal weather variations.

It is a still further object of the present invention to provide such a detection system which detects leakage of electrically conductive fluid from any configuration of storage tank and/or its transfer pipes, into the storage environment, i.e., the soil surrounding the tank and/or transfer pipes.

SUMMARY

Accordingly, an apparatus is provided which is capable of detecting leaks from a tank, pipe, or the like which contains electrically conductive fluids, wherein the tank is in contact with a soil medium. The apparatus includes a reference electrode, an alternating current source, at least one sensing electrode and a potential difference measuring device. The reference electrode is positioned so that it is spaced apart from the tank, with the alternating current source being connected between the reference electrode means and the tank and positioned relative to the tank so that an electric field is established in the soil medium between the tank and said reference electrode when the alternating current means is energized. The sensing electrode is positioned so that it is within the electric field created when said alternating current means is energized. The sensing electrode thereby acquires a potential which can be measured relative to the tank. The measuring device, such as a voltmeter, is then used to measure the potential difference between the sensing electrode and the tank. When the electrically conductive fluid from the tank leaks into the soil medium between the tank and the reference electrode, the conductivity of the soil is altered correspondingly, as is the potential difference between the sensing electrode and the tank. Hence, a significant change in the potential difference, as measured by the measuring device, is an indication that a leak has occurred in the tank.

Also, the invention includes a method for detecting leaks from a tank using the above-described apparatus. The steps of the method include: first, measuring the potential difference between the sensing electrode and the tank when it is known that the tank has no leaks; second, measuring the potential difference between each sensing electrode and the tank at successive selected time intervals following the first step; and third, comparing the values of potential difference obtained from both the first and second steps above. A substantial difference between the values obtained in the first and second steps indicates the existence of a leak in the tank.

DESCRIPTION OF THE DRAWINGS

A more thorough understanding of the invention may be obtained by a study of the following detailed description of the invention, taken in connection with the accompanying drawings in which.

DESCRIPTION OF PREFERRED EMBODIMENT

In its simplest form, the detection system of the present invention includes a system reference electrode, which is usually buried so that it partially or completely encircles the storage tank to be tested, which also is in contact with the ground, and in many cases is buried. The reference electrode may be in the form of a solid ring, or several individual reference electrodes may be connected together to form a ring-like system electrode.

A source of alternating current is connected between the system reference electrode and the storage tank, resulting in a current flow from the alternating current source, when the current source is energized, to the tank, from the tank through the ground to the system reference electrode, and then from the system reference electrode back to the alternating current source. The flow of alternating current in the circuit establishes an electric field between the test tank and the reference electrode.

A plurality of sensing electrodes, usually in the form of lengths of small-diameter pipe, are positioned between the tank and the system reference electrode. The sensing electrodes are in contact with the ground and usually buried. They further are staggered, both around the test tank and between the test tank and the system reference electrode, thereby providing in-depth sensing electrode coverage.

When the alternating current source is energized, and the electric field established between the test tank and the system reference electrode, a measurable value of electric potential will exist between each sensing electrode and the tank. This electric potential may be conveniently measured by standard test equipment, such as a voltmeter. Leaks from the test tank may be detected by comparing successive values of electric potential at one or more of the sensing electrodes.

When a leak in the test tank occurs, the waste, or other electrically conductive, solution spreads outwardly into the storage environment. The electric field in the soil is substantially affected by the leak, because the solution dramatically alters the conductivity of the soil. As a result, the value of the electric potential at each of the sensing electrodes in or near the volume of soil affected will change significantly. Any substantial change in the measured values of electric potential at one or more sensing electrodes from a previously measured nominal (no leak) value is hence a positive indication that a leak in the test tank has occurred. The magnitude and configuration of the change in electric potential will reflect both the magnitude and location of the leak.

Figure 1:
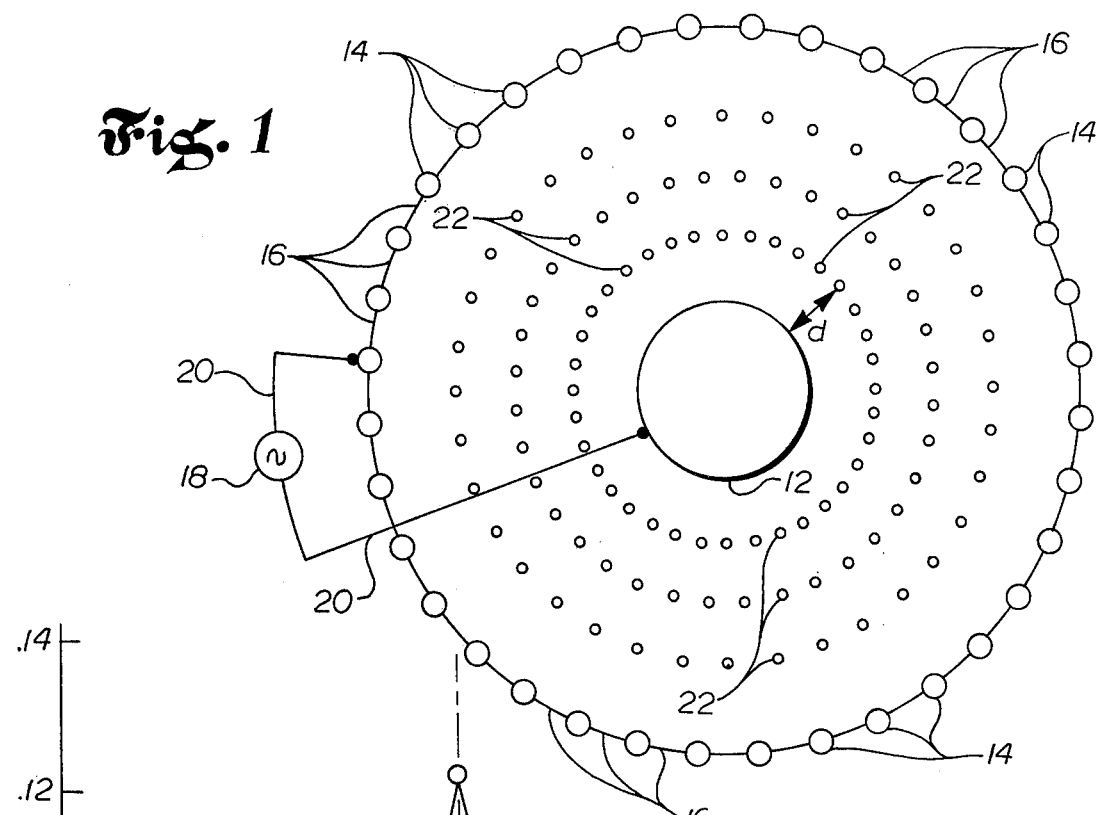
FIG. 1 is a plan view showing a detection system of the present invention in a single tank configuration.

Referring now specifically to FIG. 1, one embodiment of the detection system of the present invention specifically adapted for use with a single storage tank of radioactive waste solution is shown. Although the embodiment of FIG. 1 specifically is directed to a storage tank for radioactive wastes, it should be understood that the principles of the invention are applicable to storage of other electrically conductive fluids.

Tanks used for storage of liquid or semi-liquid radioactive waste solutions are typically quite large, on the order of 80 feet in diameter, with a capacity of 500,000–1,000,000 gallons. In a typical use, the tank is buried and covered by a substantial depth of soil. Although the actual construction of such storage tanks varies, they usually will include a wire mesh reinforced cement exterior wall, a three-ply asphaltic membrane, another wall of reinforced concrete, a layer of gunite, another three-ply asphaltic membrane, a steel tank liner, and an inner lead sheet lining. Although the thickness of these walls will vary, the total may be on the order of one foot, or greater.

Such a storage tank also has a specially constructed lid, as well as a riser which extends from the tank to the ground surface. The system of the present invention can accommodate various tank configurations and designs, although a source of good electrical contact with the tank is necessary for proper system operation. This is usually provided by the tank riser.

Referring to FIG. 1, individual reference electrodes 14—14 are electrically conductive elements which are typically buried a relatively substantial distance from storage tank 12, in one embodiment approximately 20 feet. Individual reference electrodes 14—14 may take a variety of configurations. An effective individual reference electrode is a length of six-inch diameter pipe, approximately as long as the storage tank. A series of such pipes may be used to partially or completely encircle storage tank 12, and when connected by an electrically conductive link 16, as shown in FIG. 1, form a ring-like system reference electrode around storage tank 12. Alternatively, the system reference electrode could be a solid ring-like sheet of electrically conductive material, either partially or completely encircling storage tank 12, or in some cases, could be just one individual reference electrode 14.

As a practical matter, when a tank farm comprising a plurality of test tanks is being monitored for leaks with the apparatus of the present invention, storage tanks adjacent to the one under test will form the system reference electrode for the test tank. In such a circumstance, the configuration of the system reference electrode is determined by the configuration of the other tanks, the manner in which they are connected, and the physical relationship between the test tank and the other tanks.

Although the actual distance separating storage tank 12 in FIG. 1 and the ring of individual reference electrodes 14—14 is not critical, it has been found that a separation on the order of 20 feet or better is preferred for accurate detection of leaks. Additionally, it has been found that a relatively good ohmic contact should exist between the soil and the system reference electrode, preferably an order of magnitude better than the ohmic contact between the soil and the test tank.

Connected between test tank 12 and the system reference electrode, in FIG. 1 is AC generator 18. For proper operation, there should be good electrical contact between AC generator 18, test tank 12 and the system reference electrode, i.e. one individual reference electrode 14. Although various electrically conductive means may be utilized to connect AC generator 18 with reference electrode 14 and test tank 12, the embodiment shown and described uses $\frac{3}{8}''$ to $\frac{1}{2}''$ diameter copper tubing 20.

The voltage level and frequency of the signal from AC generator 18 are important for the proper operation of the system. Although no ideal voltage level or frequency is specified herein, general operating ranges for both signal voltage and frequency for the embodiment disclosed herein have been discovered.

It is desirable that the signal voltage be as low as practical, so as to minimize the amount of power put into the system. There is hence virtually no absolute lower limit on the voltage level. However, it has been found that the soil background noise in a typical installation at frequencies other than DC or the local power line frequency and its harmonics is approximately 1 millivolt. In order for the system to have a reasonable signal/noise ratio, a practical lower voltage level is approximately $\frac{1}{2}$ volt. Above this level, the signal from AC generator 18 becomes progressively easier to distinguish against the background noise, although at the cost of more power being used in the system.

Generally, the clarity of the signal against the background increases as the signal voltage level increases. Once the voltage level rises above ten volts, however, the system, from a power standpoint, is no longer practical. It has been found that an acceptable range of signal voltage for the embodiment shown and described is between $\frac{1}{2}$ volt and five volts. With average soil conditions, this range of voltage will result in a current flow in the circuit of between one and ten amperes.

The selection of signal frequency is likewise a compromise between competing considerations. If the current path includes a soil medium between reference electrode 14 and test tank 12, low frequencies, on the order of ten hertz, may be used, although at very low frequencies, adverse galvanic effects on the storage tank occasionally result.

In some applications, however, the current path between storage tank 12 and reference electrode 14 includes an electrically conductive pipe, which raises the practical lower limit of the signal frequency to approximately one kilohertz. If the signal frequency is much lower than that, the inductive reactance of the current path becomes so low that the power necessary to establish desirable levels of electric potential (e.g. one volt) at the sensing electrodes increases to a level which is not suitable for practical operation of the system.

The skin effect phenomenon is a consideration which is relevant to the upper limit of the signal frequency. Skin effect results in a substantial degradation of system performance when the signal frequency is increased above 100 kilohertz. At these high frequencies, the electric field established in the soil between test tank 12 and reference electrode 14 tends to remain near the surface of the ground, significantly limiting the system's capability of detecting tank leaks which occur much below the surface of the ground. An acceptable range of signal frequencies has been found to be between three and ten kilohertz.

In operation, a potential difference of approximately one volt is maintained between reference electrode 14 and storage tank 12, as current flows through the circuit comprising AC generator 18, copper tubing 20, storage tank 12, the soil medium and connecting pipes (not shown), and reference electrode 14. The current flow establishes an electric field in the soil between storage tank 12 and reference electrode 14. The electric field will alternately expand and collapse in accordance with the variations in the alternating current.

A plurality of sensing electrodes 22—22 are positioned between storage tank 12 and the system reference electrode. Sensing electrodes 22—22 are electrically conductive, and in the embodiment shown and described comprise six-to-eight inch diameter pipes, which extend vertically into the soil to at least the depth of storage tank 12.

Sensing electrode 22—22 may vary significantly in size, as even one-half inch diameter solid metal rods have been found to operate successfully. Sensing electrodes 22—22 may also vary in length, although preferably they will extend to a depth somewhat greater than the depth of the tank under test, to increase the chance of detecting leaks which occur near the bottom of the test tanks.

In the embodiment shown and described, sensing electrodes 22—22 are located in three concentric fields, with each field comprising a circular row of individual sensing electrodes located a specified distance from tank 12, e.g. distance "d" for those sensing electrodes positioned in the first concentric field. Greater or fewer sensing electrode fields than the number shown may be used, or the electrodes may be arranged in a random pattern between storage tank 12 and the system reference electrode. Although sensing electrodes 22—22 need not necessarily surround storage tank 12, it is advantageous that they do so, to insure accurate location of the source of a particular leak.

In operation, when AC generator 18 is energized, each sensing electrode 22 will acquire a potential difference relative to tank 12. This potential difference may be conveniently measured by a voltmeter connected between each sensing electrode 22 in turn and storage tank 12.

The above defined elements, when combined into an operating system, provide an accurate, prompt indication of the existence of a leak in one or more storage tanks. The embodiment shown and described has been tested in a wide variety of soil conditions and the results have been uniformly successful. For best operation, the soil medium should have a conductivity of less than 1.0 MHO per meter.

Figure 2:
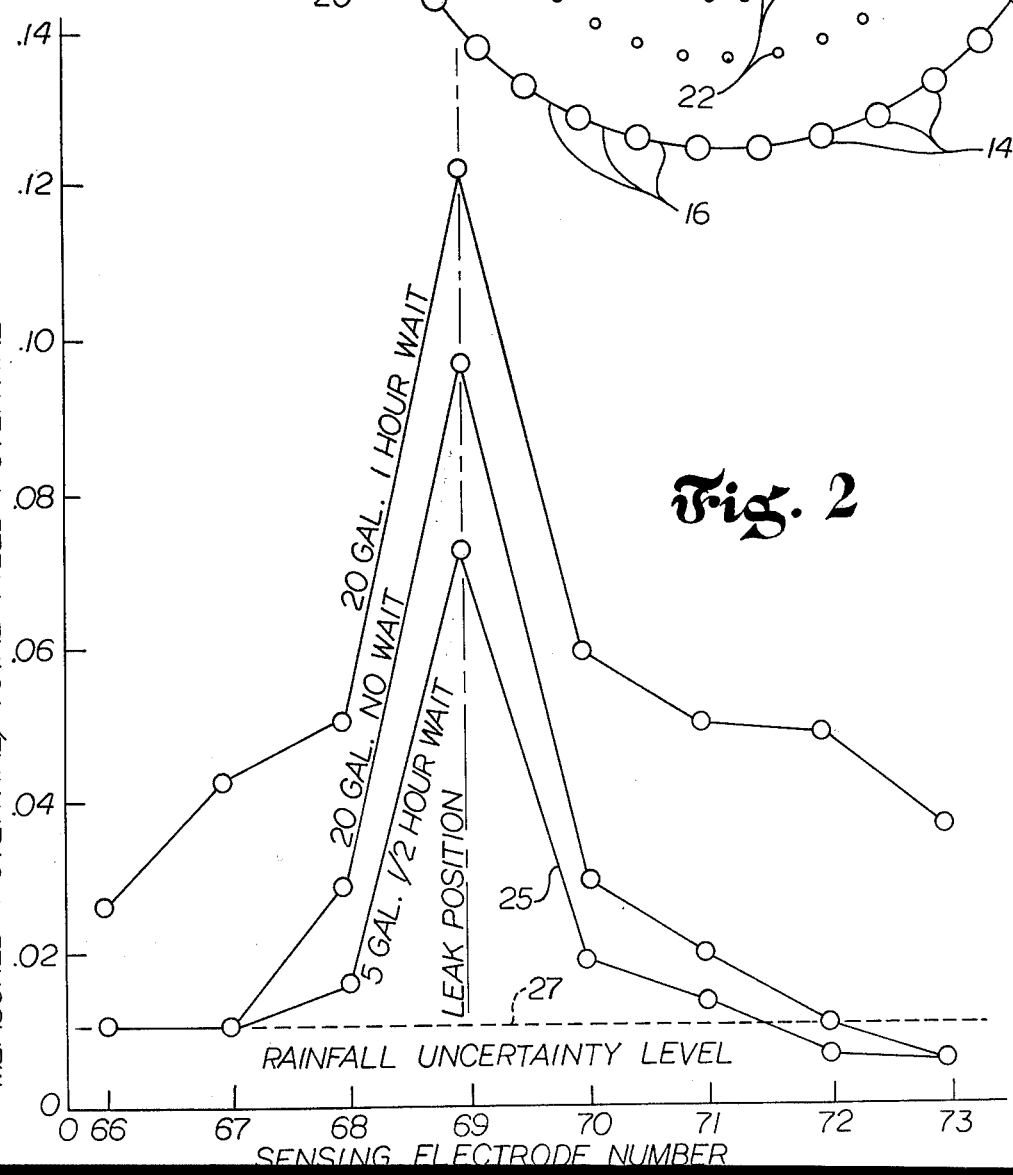
FIG. 2 is a graph showing the relative effect of several types of leaks on the electric field potential of selected sensor electrodes in, for instance, the system configuration of FIG. 1.

The graph of FIG. 2 shows the relative sensitivity of the system to leaks of a saline solution, and its relative insensitivity to rainfall. Hence, it is unlikely that a significant change in potential level at one or more of the sensing electrodes is due to a cause other than a tank leak.

FIG. 2 demonstrates the selective response of the system to tank leaks and the capability of the system to pinpoint the location of the leak. In FIG. 2, the nominal potential for each sensing electrode is at or slightly below the rainfall uncertainty level 27. The response of the system is shown when a leak occurs in the test tank in the vicinity of sensing electrode 69. Changes in the electric potential measured at several sensing electrodes close to the source of the leak are dramatic, and hence easily recognizable, for even the smallest leaks, e.g. the 5 gallon leak of curve 25. The measured response of the system to a particular leak depends both on the volume of the leak, and the time between occurrence of the leak and the measurement of electric potential.

In the operation of the present system, the electric potential at each sensing electrode 22 is measured periodically. The resulting plurality of electric potential measurements taken at a given time are then displayed in a visual layout, referred to as an electric potential map. When storage tank 12 is of substantial depth, a series of electric potential maps are usually prepared. Each electric potential map corresponds to a different depth, since the leakage condition, if any, may well vary between the top and bottom of the test tank.

Figure 3:
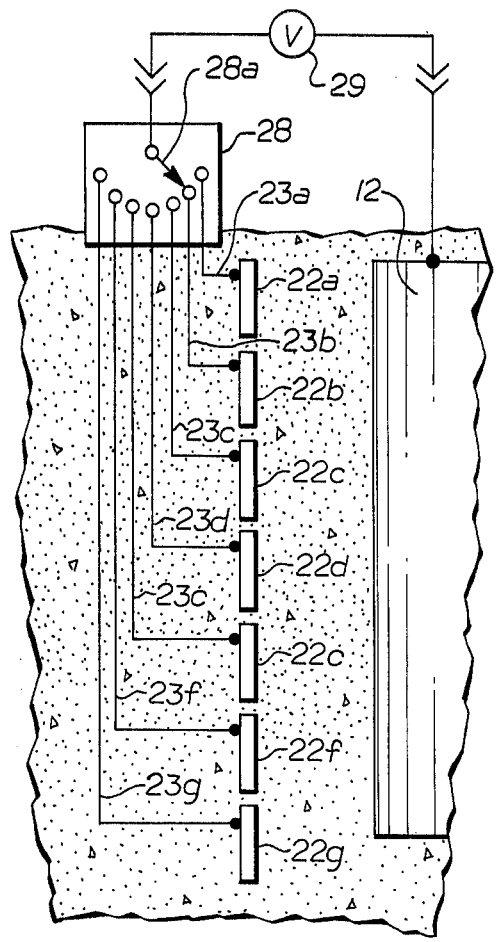
FIG. 3 is a side view of a test arrangement wherein a single sensor electrode, shown in segmented form, is positioned underground a selected distance from the storage tank under test.

The system of FIG. 3 is used to prepare the series of electric potential maps. The sensing electrode 22 in FIG. 3 comprises a plurality of segments 22a-22g. Connections 23a-23g extend from their respective corresponding segments 22a-22g to a conventional switching device 28. A voltmeter 29 is connected between storage tank 12 and the movable arm 28a of switching device 28. Such an arrangement permits electric potential maps to be made at one or more of the specific depths corresponding to the location of segments 22a-22g. The segmenting of the sensing electrodes 22—22 somewhat complicates the system, but results in a more rapid and accurate identification of the location and volume of a given leak.

In order for the mapping operation to be meaningful, a reference must be established. This is done by preparing a map of lines of equal potential for a nominal (no leak) soil condition. The resulting reference map may be either quite simple or quite complicated, depending upon the number of lines of equal potential drawn and the number of different segments used on a single display.

Figure 4A:
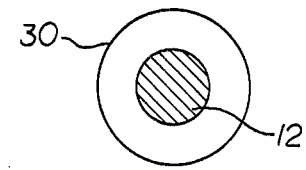
FIGS. 4a, 4b and 4c are diagrams of lines of equal potential for a single tank for: (1) a nominal soil condition; (2) a leak extending radially equally from the test tank; and (3) a leak concentrated in one radial direction from the test tank.
Figure 4B:
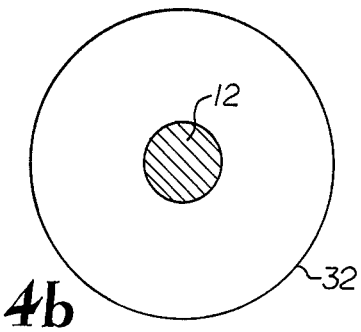
Figure 4C:
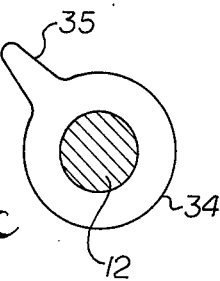

FIGS. 4a through 4c show three simple electric potential maps, each map displaying a single equal potential line, corresponding to a single sensing electrode segment. The map of FIG. 4a is for a nominal soil condition. It includes a storage tank 12 and an equal potential line 30 which is the locus of measured values from a series of individual sensing electrodes 22 having the same electric potential. In an ideal condition, equal potential line 30 in the nominal case will be a circle, concentric with storage tank 12. It should be understood, however, that in an actual case even a nominal map may vary substantially from that shown in FIG. 4a.

Occasionally, a leak will occur which effects a substantially equal change in the shape of lines of equal potential. The effect of such a leak must be equal in all directions, as in a leak from the bottom center of the tank. Such a condition is demonstrated in the map of FIG. 4b. The nominal position of the line of equal potential 32 in FIG. 4b has expanded considerably out from that in FIG. 4a, but maintains the identical configuration. The only way that such a leak can be ascertained is through a direct comparison of periodically prepared maps with the nominal map in FIG. 4a.

In most cases, however, the leak will occur at a location on the tank which will result in a distortion or localized anomaly in the lines of equal potential of the map. Virtually any leak which occurs in the circumferential wall of a tank will result in such a localized distortion of one or more equal potential lines on the map. An example of such a map is shown in FIG. 4c, which shows a storage tank 12 and an equal potential line 34 which has a noticeable anomaly 35 in one portion thereof. The presence of such a distortion in one or more equal potential lines is an unmistakeable indication to the interpreter of the maps that a leak in the tank has occurred, and hence that immediate investigation and disposition is required.

The equal potential maps of FIGS. 4a-4c are very simple, illustrating in each instance a single equal potential line for a single sensing electrode segment. A more practical display will typically include at least several additional lines of equal potential for specified values of potential, and perhaps will include several sets of equal potential lines, one set for each plurality of segments, wherein a plurality of segments exits for each given depth. These maps are furnished to an operator and/or to automatic processing equipment for inspection.

Figure 5:
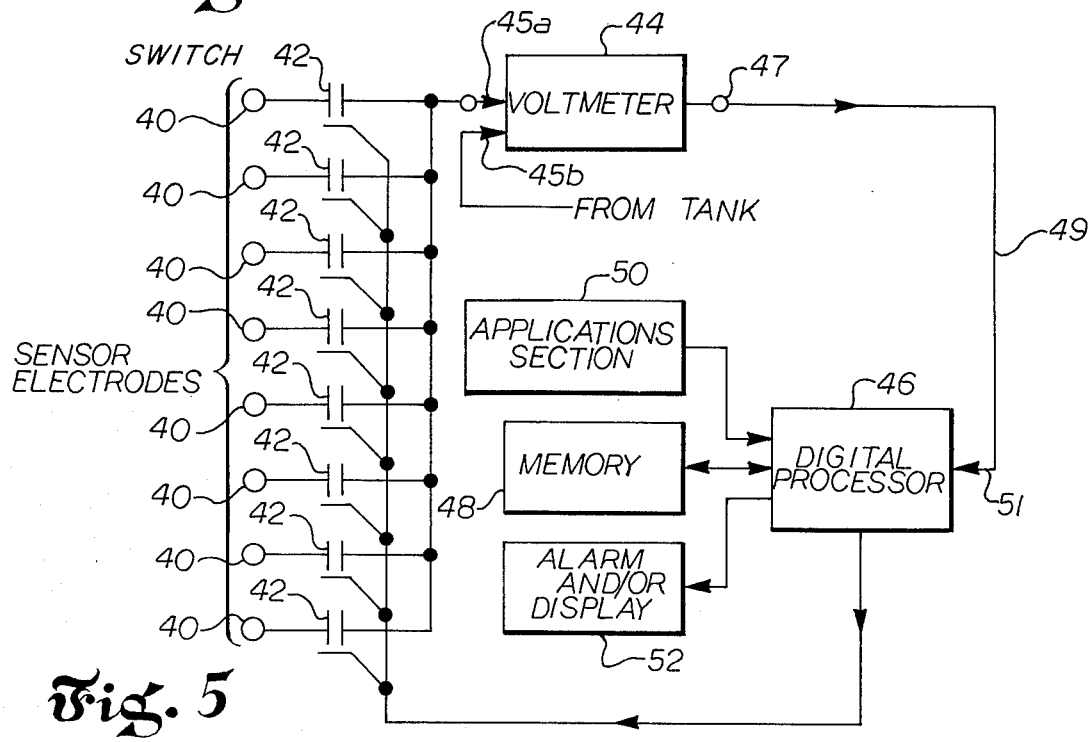
FIG. 5 is a block diagram showing a structure for mapping lines of equal potential for a given test tank.

The mapping capability may be provided by an automatic measuring and processing system, such as that shown in FIG. 5. Otherwise, the potential difference at each sensing electrode 22—22 must be measured by hand, and the resulting measurements individually plotted to form the map.

Referring now to FIG. 5, a set of eight sensing electrodes 40—40 are shown, each of which is selectively connected in turn, under control of digital processor 46, through an associated solid state switch 42-42 to a voltmeter 44, which measures the potential difference between the sensing electrodes 40—40 and the storage tank (not shown) by its input connections 45a and 45b. Although eight sensing electrodes 40—40 are present in the embodiment shown in FIG. 5, it should be understood that virtually any number of sensing electrodes can be similarly accommodated, each one having a corresponding solid state switch 42 selectively connecting it to voltmeter 44.

The value of the voltmeter measurement is applied from an output connection 47 over line 49 to digital processor 46. It is received by digital processor 46 at input 51, and recorded in memory 48, along with an identification of the particular sensing electrode being interrogated. This process of interrogation, measurement, transmission and recording is accomplished for each sensing electrode in turn. An electric potential map is then prepared by processor 46 under the control of a stored program in applications section 50, and the resulting map is then stored in memory 48.

Following the preparation of the nominal map, successive maps are prepared by the apparatus of FIG. 5 at successive specified time intervals. After each new map is prepared, it is compared both with the nominal map and the last previous map by digital processor 46 under the control of another program stored in applications section 50. The leak resulting in the mapping anomaly of FIG. 4b would be detected through a comparison between the just-completed map and the nominal map, while the leak resulting in a mapping of an anomaly similar to that of FIG. 4c is usually most accurately determined by comparing the just-completed map with the last previous map.

The comparison program in applications section 50 has built into it acceptable and unacceptable anomaly ranges. Once the difference between either the nominal map or the last previous map and the just-completed map is sufficiently great as to be in the unacceptable range, an alarm or similar device 52 may be activated to provide an aural and/or visible indication to the operator that a leak has been detected and hence, that corrective action is necessary. Under selected circumstances, i.e. where acceptable comparison ranges for both the nominal map and the last previous map are violated, the just-completed map is read out in a display for examination by the operator.

After each comparison is concluded, the just-completed map is substituted in memory 48 for the last previous map, and digital processor 46 is now ready for processing the next measurement from voltmeter 44. The time interval between successive mappings will vary widely, in accordance with circumstances and the desire of the operator. Typically, the interval will vary from once a day to perhaps as infrequently as once a month.

Figure 6:
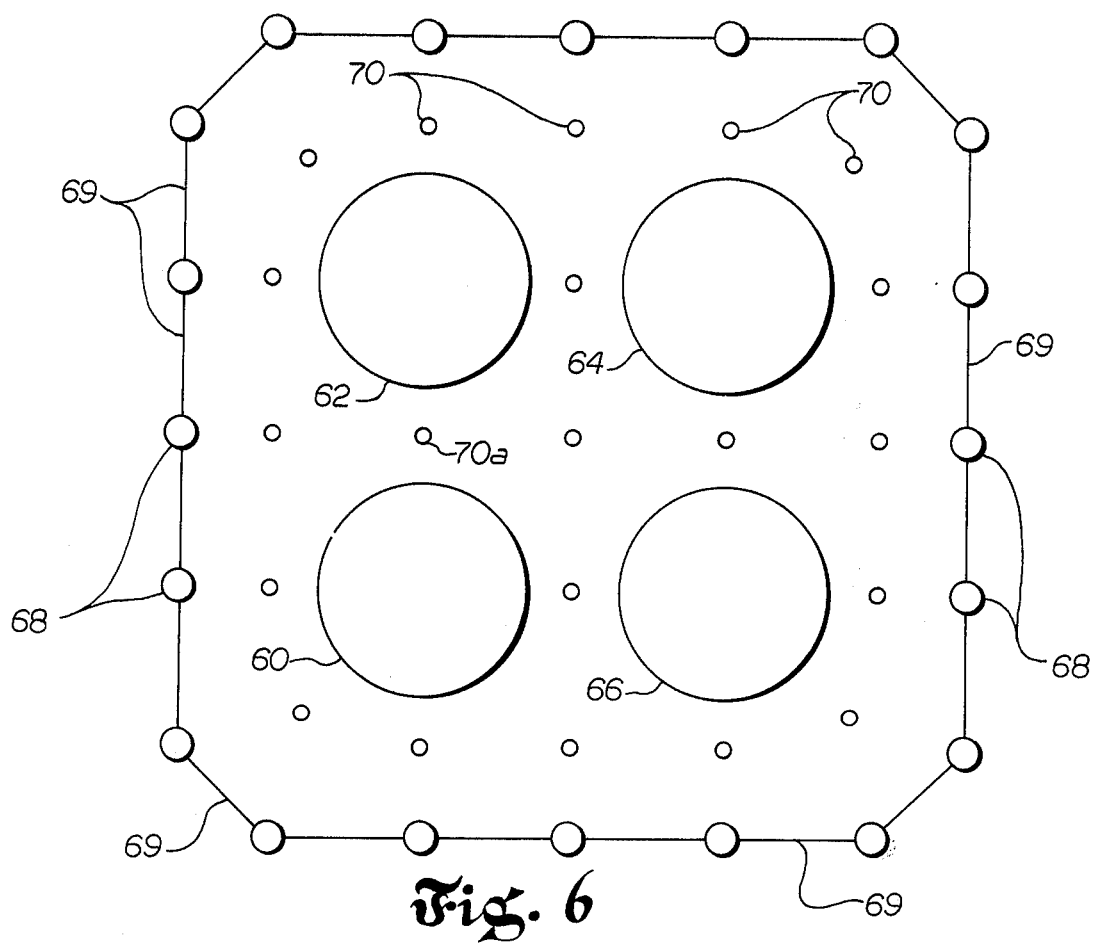
FIG. 6 is a plan view of a tank farm and a corresponding detection system embodying the principles of the present invention.

It is relatively infrequent that a storage tank will be isolated, such as shown in the embodiment of FIG. 1. FIG. 6 shows a more practical physical arrangement of storage tanks. The detection system of the present invention may be easily adapted to such an arrangement. FIG. 6 shows a tank farm, exemplified by tanks 60, 62, 64 and 66, each of which is sequentially interrogated in turn by the detection system.

Storage tanks 60, 62, 64 and 66 are surrounded by a ring of individual reference electrodes 68—68 which encircle the tank farm and are connected together by link 69 to form a system reference electrode.

Although individual reference electrodes 68—68 may be lengths of large-diameter pipe, more typically they will be adjacent storage tanks in the tank farm. The adjacent storage tanks in FIG. 6 are shown substantially smaller than tanks 62, 64, 66 and 68 only for convenience of illustration. As with the single tank system, it is not necessary that the tank under test be surrounded by a reference electrode, although such an arrangement will be convenient to implement in a tank farm. It should also be understood that a practical tank farm will incorporate a greater number of individual storage tanks than is shown in FIG. 6.

The tank farm arrangement shown in FIG. 6 has the additional advantage of reducing the total number of sensing electrodes which would otherwise be necessary for the interrogation of individual storage tanks in the tank farm. Sensing electrodes may be conveniently shared by one or more tanks in the tank farm, i.e. sensing electrode 70a may be utilized for testing both tank 60 and tank 62.

The system configuration of FIG. 6 includes a plurality of sensing electrodes 70—70, which are arranged to provide the information necessary for the mapping of each storage tank 60, 62, 64, 66 in turn. Only a single depth or ring of sensing electrodes 70—70 is shown in FIG. 6, as compared to the more indepth coverage illustrated in FIG. 1. It should be understood that addditional sensing electrodes can be used in the embodiment of FIG. 6 to provide the indepth mapping capability of the embodiment of FIG. 1.

Figure 7:
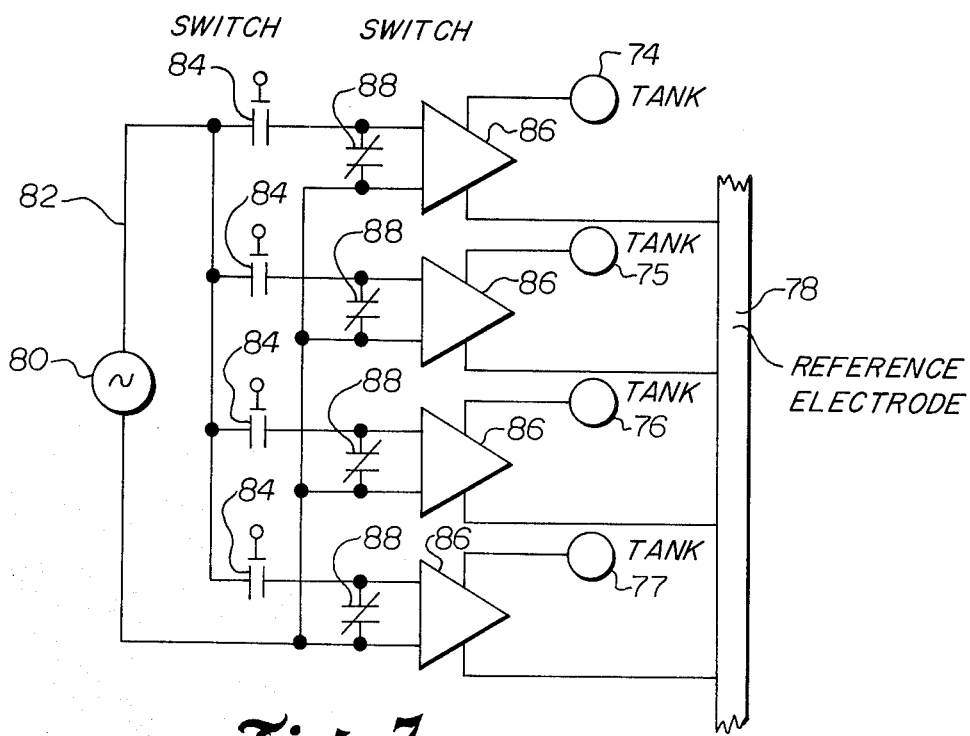
FIG. 7 is a block diagram showing a partial configuration of a switching control circuit for sequentially testing the individual tanks comprising the tank farm shown in FIG. 6.

A tank farm may include a switching system for automatically sequencing the interrogation of the several tanks therein. An exemplary switching system for a four-tank tank farm is shown in FIG. 7. The principles of the circuit shown in FIG. 7 can, of course, be extended to cover a large number of tanks. Storage tanks 74, 75, 76 and 77 are shown, along with a section 78 of a system reference electrode, and an AC generator 80. One side of AC generator 80 is connected through line 82 and solid-state switches 84—84, which are under the control of a sequencing means (not shown), to one input of each of a plurality of power amplifiers 86—86. The other side of AC generator 80 is connected directly to another input of each power amplifier.

Power amplifiers 86—86 function as an impedance matching device, since the solid state switches 84—84 do not have a sufficiently low output impedance, i.e. 10 ohms, to match the input impedance of the associated storage tanks 74-77. The input impedance of power amplifiers 86—86 can be made sufficiently high to match the output impedance of switches 84—84, while the output impedance of power amplifiers 86—86 match the low input impedance of the storage tanks.

Each of the power amplifiers 86—86 also includes a solid-state switch 88 which is connected across its input and which can be shorted to give its associated power amplifier 86 such a low output impedance that its associated storage tank assumes the electrical potential of reference electrode section 78.

The system of FIG. 7 thus permits an automatic sequential interrogation of each storage tank in the tank farm. When the tank switching system of FIG. 7 is combined with the mapping system of FIG. 5, the entire interrogation process for a tank farm is performed automatically, with a minimum of human intervention. This results in a reliable mapping system that is capable of maintaining regular surveillance over a large number of individual storage tanks, without need of extensive human resources.

Thus, a detection system is provided which is useful for detecting leaks from tanks currently being used to store liquid or semi-liquid radioactive waste products. The stored solution could also be one of any number of electrically conductive fluids. The system includes a plurality of sensing electrodes positioned at various locations between a particular storage tank under test and a system reference electrode. The test tank and the system reference electrode are connected by a source of alternating current. By successively interrogating each of the sensing electrodes, lines of equal potential may be determined and mapped. The resulting map may be then compared with a nominal map as well as the last previous map to determine the presence of distortions, which in turn indicate the size and location of a particular leak.

Although a preferred embodiment of the invention has been disclosed herein for purposes of illustration, it should be understood that various changes, modifications and substitutions may be incorporated in such embodiment without departing from the spirit of the invention which is defined by the claims which follow:

What is claimed is:

1. An apparatus for detecting leaks from a tank, pipe, or the like which contains electrically conductive fluid, wherein the tank is in contact with a soil medium, said apparatus comprising:

(a) reference electrode means spaced apart from the tank;

(b) alternating current means connected between said reference electrode means and the tank and positioned relative to the tank such that an electric field is established in the soil medium between the tank and said reference electrode means when said alternating current means is energized;

(c) at least one sensing electrode means positioned so that it is within said electric field when said alternating current means is energized, a potential difference being created between said sensing electrode means and the tank when said electric field is established; and (d) means for measuring said potential difference, a leak of the electrically conductive fluid from the tank into the soil medium between the tank and the reference electrode causing a change in the conductivity of the soil medium and a measurable change in the potential difference between the tank and said sensing electrode means.

2. An apparatus of claim 1, wherein the conductivity of the soil medium is no higher than 1.0 MHO per meter prior to a leak.

3. An apparatus of claim 1, wherein said apparatus includes a plurality of sensing electrode means arranged so as to substantially encircle the tank.

4. An apparatus of claim 3, wherein said plurality of sensing electrode means are arranged into several rows which each substantially encircle the tank.

5. An apparatus of claim 3, wherein each sensing electrode means extends vertically down in the soil medium to at least the lowest depth of the tank.

6. An apparatus of claim 1, wherein said sensing electrode means comprises a plurality of segments positioned at different depths in the soil medium and further includes switching means selectively connecting each of said segments to said measuring means.

7. An apparatus of claim 3, wherein said sensing electrode means are substantially smaller in diameter than the tank.

8. An apparatus of claim 1, wherein said reference electrode means includes at least one other tank.

9. An apparatus of claim 1, wherein said reference electrode means substantially encircles the tank.

10. An apparatus of claim 9, wherein said reference electrode means includes a plurality of additional tanks, and further includes electrically conductive means linking said plurality of additional tanks together about the tank.

11. An apparatus of claim 1, wherein said alternating current means, when energized, produces a signal having a voltage within the range of one-half volt to five volts and a frequency of less than one hundred kilohertz.

12. An apparatus of claim 1, wherein said apparatus is useful with a plurality of tanks, said apparatus further including means for connecting said alternating current means between said reference electrode means and each of said plurality of tanks.

13. An apparatus of claim 1, wherein the apparatus includes a plurality of sensing electrode means, and further includes means for connecting each of said plurality of sensing electrode means to said measuring means.

14. An apparatus of claim 12, wherein said connecting means includes a plurality of switching means for selectively connecting each of said plurality of tanks between said alternating current means and said reference electrode means.

15. An apparatus of claim 14, wherein said selective connecting means further includes a plurality of power amplifiers, each power amplifier being connected between a tank and its associated switching means, wherein said power amplifiers are operable to match the impedance of the tanks to their associated switching means.

16. An apparatus of claim 15, wherein each power amplifier includes a shorting switch connected across its input, said shorting switch, when energized, producing a short circuit across the input of the power amplifier, so that the power amplifier has such a low output impedance that the tank to which it is connected acquires approximately the same electrical potential as that of said reference electrode means.

17. A method for detecting leaks from a tank, or the like, which contains electrically conductive fluid, wherein the tank is in contact with a soil medium, and wherein the method uses a reference electrode, an alternating current means, and a sensing electrode means, the reference electrode being spaced apart from the tank, the alternating current means being connected between the reference electrode and the tank and being positioned relative to the tank such that an electric field is established in the soil medium between the tank and said reference electrode means when the alternating current means is energized, the sensing electrode means being positioned so that it is within the electric field when the alternating current means is energized, the method comprising the following steps:

(a) measuring the potential difference between said sensing electrode and the tank for a nominal, i.e. no leak, tank condition;

(b) measuring the potential difference between each sensing electrode and the tank at selected time intervals following step (a) above;

(c) comparing the values of potential difference obtained by steps (a) and (b), a substantial difference therebetween being indicative of the existence of a leak in the tank.

18. The method of claim 17, wherein a plurality of sensing electrodes is provided within the electric field established when the alternating current means is energized and wherein steps (a) and (b) each include the further step of measuring the potential difference between the tank and each of said plurality of sensing electrodes, and wherein the method includes the additional step of determining lines of equal potential relative to the tank for both steps (a) and (b), the lines of equal potential for step (a) being a nominal plot and for step (b) being a measured plot, and wherein the step of comparing includes the step of comparing said measured plot with said nominal plot, a substantial difference therebetween being indicative of the existence of a leak in the tank.

19. A method of claim 18, wherein step (b) includes the steps of measuring the potential difference at least at two points in time following step (a) and wherein the step of determining lines of equal potential of the last measured values of potential difference results in the measured plot, and wherein the step of determining lines of equal potential of the last previous measured values results in the last previous plot, and wherein the step of comparing includes the step of comparing said measured plot with both said nominal plot and said last previous plot.

* * * * *